(12) United States Patent
Murai

(10) Patent No.: US 10,811,445 B2
(45) Date of Patent: Oct. 20, 2020

(54) SEMICONDUCTOR DEVICE, METHOD OF MANUFACTURING SEMICONDUCTOR DEVICE, AND DISPLAY UNIT

(71) Applicant: JOLED INC., Tokyo (JP)

(72) Inventor: Atsuhito Murai, Tokyo (JP)

(73) Assignee: JOLED INC., Tokyo (JP)

(*) Notice: Subject to any disclaimer, the term of this patent is extended or adjusted under 35 U.S.C. 154(b) by 68 days.

(21) Appl. No.: 15/830,503

(22) Filed: Dec. 4, 2017

(65) Prior Publication Data

US 2018/0158848 A1   Jun. 7, 2018

(30) Foreign Application Priority Data

Dec. 5, 2016 (JP) ................................ 2016-235981

(51) Int. Cl.
| | | |
|---|---|---|
| H01L 27/12 | (2006.01) | |
| H01L 29/786 | (2006.01) | |
| H01L 29/417 | (2006.01) | |
| H01L 29/423 | (2006.01) | |
| H01L 27/32 | (2006.01) | |

(52) U.S. Cl.
CPC ...... *H01L 27/1296* (2013.01); *H01L 27/1225* (2013.01); *H01L 27/1248* (2013.01); *H01L 27/1255* (2013.01); *H01L 29/41733* (2013.01); *H01L 29/42384* (2013.01); *H01L 29/7869* (2013.01); *H01L 29/78675* (2013.01); *H01L 29/78696* (2013.01); *H01L 27/3262* (2013.01); *H01L 27/3265* (2013.01); *H01L 2227/323* (2013.01)

(58) Field of Classification Search
CPC ............. H01L 27/1296; H01L 27/1255; H01L 29/78675; H01L 29/7869; H01L 27/3265
See application file for complete search history.

(56) References Cited

U.S. PATENT DOCUMENTS

| | | | |
|---|---|---|---|
| 6,380,009 B1* | 4/2002 | Battersby | H01L 29/66757 257/E21.413 |
| 2005/0168415 A1* | 8/2005 | Noda | G09G 3/3233 345/76 |
| 2009/0002590 A1 | 1/2009 | Kimura | |

(Continued)

FOREIGN PATENT DOCUMENTS

| | | |
|---|---|---|
| JP | 2010-161382 A | 7/2010 |
| JP | 2016-534390 A | 11/2016 |
| JP | 2017-173505 A | 9/2017 |

*Primary Examiner* — Tuan A Hoang
(74) *Attorney, Agent, or Firm* — Hauptman Ham, LLP

(57) ABSTRACT

A semiconductor device includes a substrate. The semiconductor device further includes a first transistor. The first transistor includes a first semiconductor layer over the substrate, the first semiconductor layer including poly-silicon. The first transistor further includes a first gate electrode over the first semiconductor layer, the first gate electrode facing the first semiconductor layer. The semiconductor device further includes a second transistor. The second transistor includes a second semiconductor layer over the substrate, the second semiconductor layer including an oxide semiconductor. The second transistor further includes a second gate electrode over the second semiconductor layer, the second gate electrode facing the second semiconductor layer.

15 Claims, 12 Drawing Sheets

(56) References Cited

U.S. PATENT DOCUMENTS

| | | |
|---|---|---|
| 2012/0218485 A1* | 8/2012 | Chikama ........... G02F 1/136213 349/39 |
| 2015/0055051 A1 | 2/2015 | Osawa et al. |
| 2015/0123084 A1* | 5/2015 | Kim .................... H01L 27/1251 257/40 |
| 2015/0123960 A1* | 5/2015 | Toyomura ............ G09G 3/3233 345/212 |
| 2015/0325602 A1 | 11/2015 | Im |
| 2016/0064421 A1 | 3/2016 | Oh et al. |
| 2016/0064465 A1 | 3/2016 | Oh et al. |
| 2016/0141347 A1* | 5/2016 | Kwon ................. H01L 27/3262 257/40 |
| 2016/0307988 A1* | 10/2016 | Kim .................... H01L 27/1225 |
| 2016/0372497 A1* | 12/2016 | Lee .................... G02F 1/136213 |
| 2017/0278916 A1* | 9/2017 | Maruyama .......... H01L 27/3276 |
| 2018/0012947 A1* | 1/2018 | Lee .................... H01L 27/1222 |

* cited by examiner

SEMICONDUCTOR DEVICE, METHOD OF MANUFACTURING SEMICONDUCTOR DEVICE, AND DISPLAY UNIT

CROSS REFERENCE TO RELATED APPLICATIONS

This application claims the benefit of Japanese Priority Patent Application JP 2016-235981 filed on Dec. 5, 2016, the entire contents of which are incorporated herein by reference.

BACKGROUND

The technology relates to a semiconductor device including a thin film transistor (TFT), a method of manufacturing the semiconductor device, and a display unit using the semiconductor device.

A semiconductor device including a TFT is used as, for example, a drive circuit of a unit such as a display unit. Such a semiconductor device is described, for example, in Japanese Unexamined Patent Application Publication No. 2010-161382.

SUMMARY

In such a semiconductor device, suppressing variation in characteristics among a plurality of TFTs helps to increase uniformity of the characteristics, and to improve reliability.

A semiconductor device, a method of manufacturing the semiconductor device, and a display unit described in this disclosure help to uniformize the characteristics and to improve reliability.

A semiconductor device according to at least one embodiment of the technology includes a substrate, a first transistor, and a second transistor. The first transistor includes a first semiconductor layer and a first gate electrode in this order on the substrate. The first semiconductor layer includes poly-silicon. The first gate electrode faces the first semiconductor layer. The second transistor includes a second semiconductor layer and a second gate electrode in this order on the substrate. The second semiconductor layer includes an oxide semiconductor. The second gate electrode faces the second semiconductor layer.

A display unit according to at least one embodiment of the technology includes a semiconductor device and a display element layer. The display element layer is on the semiconductor device and includes a plurality of pixels. The semiconductor device includes a substrate, a first transistor, and a second transistor. The first transistor includes a first semiconductor layer and a first gate electrode in this order on the substrate. The first semiconductor layer includes poly-silicon. The first gate electrode faces the first semiconductor layer. The second transistor includes a second semiconductor layer and a second gate electrode in this order on the substrate. The second semiconductor layer includes an oxide semiconductor. The second gate electrode faces the second semiconductor layer.

A method of manufacturing a semiconductor device according to at least one embodiment of the technology includes forming, on a substrate, a first semiconductor layer including poly-silicon and a first gate electrode facing the first semiconductor layer in this order to form a first transistor. The method further includes forming, on the substrate, a second semiconductor layer including an oxide semiconductor and a second gate electrode facing the second semiconductor layer in this order to form a second transistor.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

DETAILED DESCRIPTION

Figure 1:
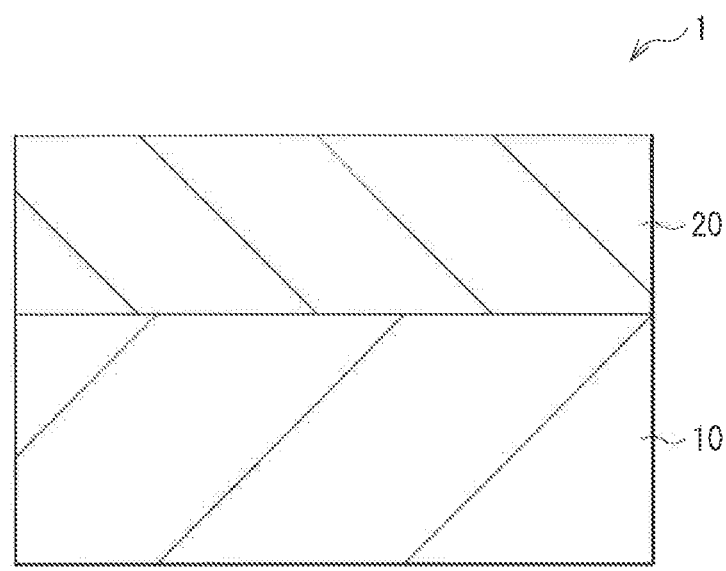
FIG. 1 is a schematic cross-sectional view of an outline configuration of a display unit according to at least one embodiment of the technology.

Some embodiments of the technology are described below in detail with reference to the accompanying drawings. Note that the description is given in the following order.
1. A display unit including a first transistor and a second transistor in a pixel circuit
2. At least one example in which the first transistor is used as a driving transistor and the second transistor is used as a switching transistor
3. At least one example in which the pixel circuit includes 3Tr1C configuration
4. At least one example including an inverter
5. Functional Configuration of Display Unit
6. At least one example of Imaging Unit
7. At least one example of Electronic Apparatus FIG. 1 is a schematic cross-sectional configuration of a display unit, i.e., a display unit 1 according to at least one embodiment of the technology. The display unit 1 may be, for example, an organic electro-luminescence (EL) unit, and includes a display element layer 20 on a semiconductor device 10. The display element layer 20 may include a plurality of pixels. Pixel circuits of the respective pixels may be in the semiconductor device 10.

Figure 2:
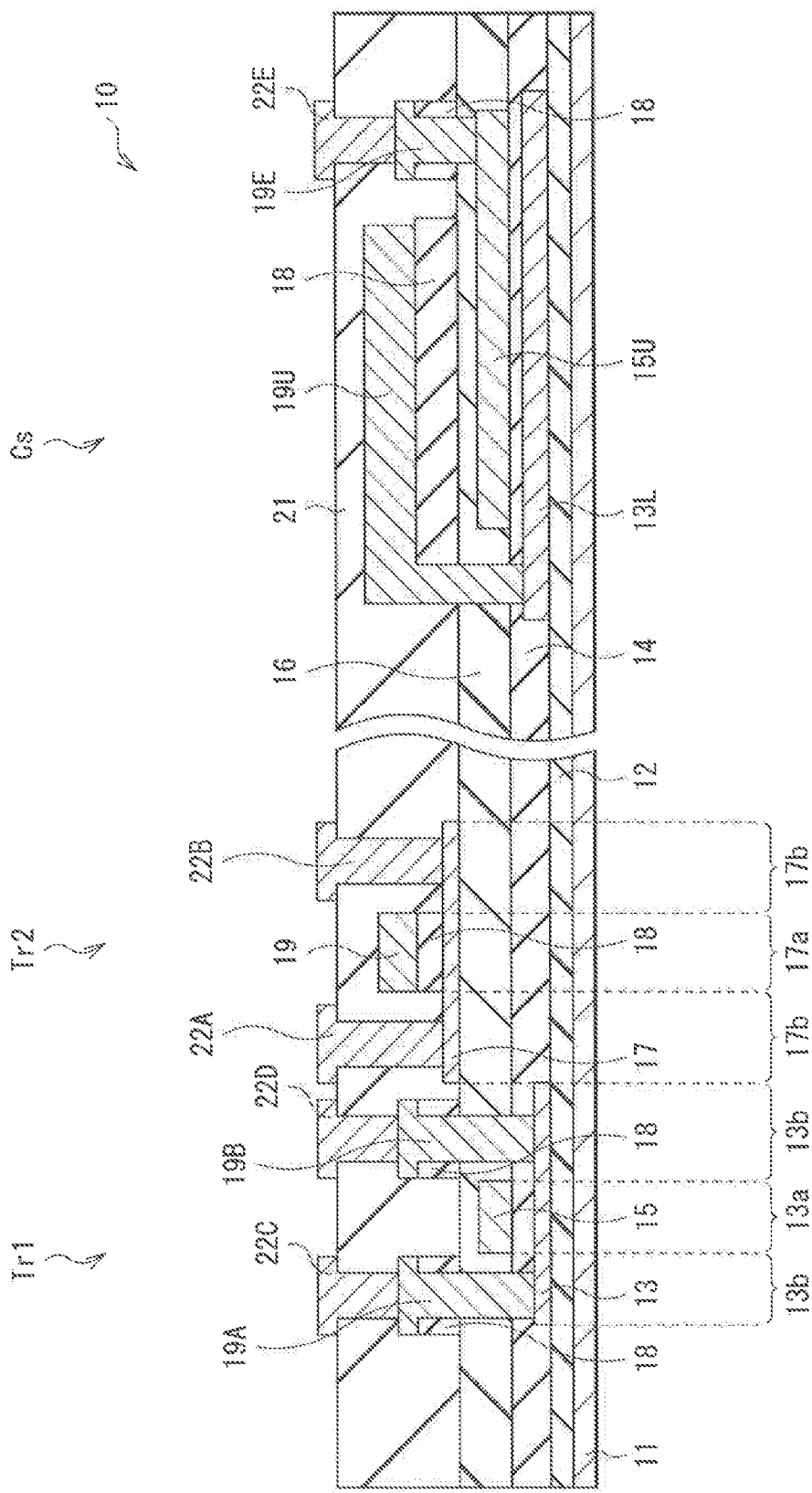
FIG. 2 is a cross-sectional view of a configuration of a semiconductor device according to at least one embodiment of the technology.

FIG. 2 is a cross-sectional diagram of a configuration of the semiconductor device 10 according to at least one embodiment of the technology. The semiconductor device 10 may include, on a substrate 11, a first transistor Tr1, a second transistor Tr2, and a storage capacitor Cs. Each of the first transistor Tr1 and the second transistor Tr2 may be, for example, an n-channel MOS TFT or a p-channel MOS TFT.

The first transistor Tr1 may include a first semiconductor layer 13 and a first gate electrode 15 in this order. The first semiconductor layer 13 may be on the substrate 11 with an UC (Under Coat) film 12 in between. The first gate electrode 15 may face the first semiconductor layer 13 with a first insulating film 14 in between. In other words, the first transistor Tr1 may be a top-gate TFT. The first gate electrode 15 may be covered with a second insulating film 16. First source-drain electrodes 19A and 19B may be electrically coupled to the first semiconductor layer 13.

The second transistor Tr2 may include a second semiconductor layer 17 and a second gate electrode 19 in this order on the second insulating film 16. The second gate electrode 19 may face the second semiconductor layer 17 with a third insulating film 18 in between. In other words, the second transistor Tr2 may be a top-gate TFT. The second gate electrode 19 may be covered with an interlayer insulating film 21. Second source-drain electrodes 22A and 22B may be electrically coupled to the second semiconductor layer 17.

The storage capacitor Cs may include a first electrode 13L, a second electrode 15U, and a third electrode 19U in this order on the UC film 12. The third electrode 19U may be electrically coupled to the first electrode 13L. The first electrode 13L, the second electrode 15U, and the third electrode 19U may have a mutually overlapping part in a plan view. In other words, the storage capacitor Cs may be a capacitive element of a stacked structure in which the second electrode 15U is interposed between the first electrode 13L and the third electrode 19U that are electrically coupled to each other. The first insulating film 14 may be provided between the first electrode 13L and the second electrode 15U. The second insulating film 16 and the third insulating film 18 may be provided between the second electrode 15U and the third electrode 19U. The third electrode 19U may be covered with the interlayer insulating film 21.

The substrate 11 may contain, for example, glass, quartz, silicon, a resin material, or a metal plate. Examples of the resin material may include polyethylene terephthalate (PET), polyimide (PI), polycarbonate (PC), or polyethylene naphthalate (PEN).

The UC film 12 may serve to prevent a substance such as a sodium ion from moving from the substrate 11 to an upper layer. The UC film 12 may contain an insulating material such as a silicon nitride (SiN) film or a silicon oxide ($SiO_2$) film. The UC film 12 may be configured by a plurality of stacked films. The UC film 12 may have a thickness of, for example, about 300 nm. For example, the UC film 12 may be configured by stacking a silicon nitride film having a thickness of 150 nm and a silicon oxide film having a thickness of 150 nm in this order on the substrate 11. The UC film 12 may be across the entire surface of the substrate 11.

[First Transistor Tr1]

The first semiconductor layer 13 may be provided in a selective region on the UC film 12. The first semiconductor layer 13 may include poly-silicon, and may include low-temperature poly-silicon (LTPS). The first semiconductor layer 13 may have a thickness of, for example, 50 nm.

The first semiconductor layer 13 may include a channel region 13a and a low-resistance region 13b. The channel region 13a may overlap the first gate electrode 15 in a plan view, and the low-resistance region 13b may be adjacent to the channel region 13a. The low-resistance region 13b may be on both sides of the channel region 13a, and have an electric resistance lower than electric resistance of the channel region 13a. The low-resistance region 13b may be doped with an n-type impurity such as phosphorus (P).

The first insulating film 14 between the first semiconductor layer 13 and the first gate electrode 15 may function as a gate insulating film of the first transistor Tr1. The first insulating film 14 may be, for example, across the entire surface of the substrate 11, cover the first semiconductor layer 13, and be provided also on the UC film 12. The first insulating film 14 may include a silicon oxide ($SiO_2$) film having a thickness of, for example, about 100 nm.

The first gate electrode 15 may be at a position facing the first semiconductor layer 13, on the first insulating film 14. The first gate electrode 15 may serve to receive application of a gate voltage to control electron density in the first semiconductor layer 13. For example, the first gate electrode 15 may contain metal such as molybdenum (Mo), tungsten (W), aluminum (Al), copper (Cu), silver (Ag), and titanium (Ti). Alternatively, the first gate electrode 15 may include an alloy, or may be made of a stacked film including a plurality of metal films. The first gate electrode 15 may include, for example, an alloy of tungsten and molybdenum (MoW) having a thickness of about 300 nm.

The second insulating film 16 may be, for example, across the entire surface of the substrate 11, cover the first gate electrode 15, and be on the first insulating film 14. The second insulating film 16 may have a function of covering a step difference caused by the first gate electrode 15 to planarize the surface. The second insulating film 16 may also serve to prevent harmful substances from entering the second semiconductor layer 17 from side of the substrate 11, which helps to improve reliability of the second transistor Tr2. The second insulating film 16 may be a stacked film of a silicon nitride (SiN) film located near the first insulating film 14 and a silicon oxide ($SiO_2$) film covering the silicon nitride film. In this situation, for example, the silicon nitride film may have a thickness of 150 nm, and the silicon oxide film may have a thickness of 100 nm. A crack, for example, caused by the step difference of the gate electrode 15 is less likely to occur in the second insulating film 16 that contains the silicon nitride film, because of superior coverage (i.e., step-covering property) of the silicon nitride film. Further, the silicon nitride film contains hydrogen (H), and the hydrogen terminates a defect in the second semiconductor layer 17.

The third insulating film 18 may be provided between the second insulating film 16 and each of the paired first source-drain electrodes 19A and 19B. The first source-drain electrodes 19A and 19B may be electrically coupled to the low-resistance region 13b of the first semiconductor layer 13 through contact holes, i.e., contact holes H1 and H2 in FIG. 8A described later provided in the third insulating film 18, the second insulating film 16, and the first insulating film 14. The first source-drain electrodes 19A and 19B each may have the planar shape same as the planar shape of the third insulating film 18 as the lower layer. The first source-drain electrodes 19A and 19B may be in a region other than the region immediately above the first gate electrode 15, for example. This helps to reduce a parasitic capacitance generated at respective intersected regions of the first gate electrode 15 and each of the first source-drain electrodes 19A and 19B.

The first source-drain electrodes 19A and 19B each may contain a metal such as molybdenum (Mo), tungsten (W), aluminum (Al), copper (Cu), silver (Ag), or titanium (Ti), for example. The first source-drain electrodes 19A and 19B may be an alloy, or may be a stacked film containing a plurality of metal films. The first source-drain electrodes 19A and 19B may be each, for example, a stacked film in which a titanium film having a thickness of about 50 nm, an aluminum film having a thickness of about 300 nm, and a titanium film having a thickness of about 50 nm are stacked in this order on the third insulating film 18.

[Second Transistor Tr2]

The second semiconductor layer 17 may be in a selective region on the second insulating film 16. The second semiconductor layer 17 may include a channel region 17a and a low-resistance region 17b. The channel region 17a may overlap the second gate electrode 19 in a plan view, and the low-resistance region 17b may be adjacent to the channel region 17a.

The second semiconductor layer 17 may include an oxide semiconductor. As used herein, the oxide semiconductor refers to a compound containing oxygen and an element such as indium (In), gallium (Ga), zinc (Zn), or tin (Sn). The second semiconductor layer 17 may be an amorphous oxide semiconductor, or alternatively may be a crystalline oxide semiconductor. Examples of the amorphous oxide semiconductor may include indium-gallium-zinc oxide (IGZO). Examples of the crystalline oxide semiconductor may include zinc oxide (ZnO), indium-zinc oxide (IZO), indium-gallium oxide (IGO), indium-tin oxide (ITO), or indium oxide (InO). The second semiconductor layer 17 may have a thickness of, for example, about 30 nm.

The low-resistance region 17b of the second semiconductor layer 17 may be a region with electric resistance lower than that of the channel region 17a. The low-resistance region 17b may be provided adjacently to and on each of both sides of the channel region 17a. For example, a part of the second semiconductor layer 17 other than the channel region 17a may be the low-resistance region 17b.

The third insulating film 18 between the second semiconductor layer 17 and the second gate electrode 19 may function as a gate insulating film of the second transistor Tr2. The third insulating film 18 may have the planar shape same as the planar shape of the second gate electrode 19. The third insulating film 18 and the second gate electrode 19 may be provided to overlap each other in a plan view. In other words, the second transistor Tr2 may have a self-aligned element structure. For example, the third insulating film 18 may be a single layer film such as a silicon oxide ($SiO_2$) film, a silicon nitride (SiN) film, and silicon oxynitride (SiON) film, or may be a stacked film. The third insulating film 18 may have a thickness of, for example, about 200 nm.

The second gate electrode 19 on the third insulating film 18 may face the channel region 17a of the second semiconductor layer 17 with the third insulating film 18 in between. The second gate electrode 19 may serve to receive application of a gate voltage to control electron density in the channel region 17a. As described later, the second gate electrode 19 may be in the same steps as those of the first source-drain electrodes 19A and 19B of the first transistor Tr1. Accordingly, the second gate electrode 19 may include the same material as the material of the first source-drain electrodes 19A and 19B, and have the same thickness as that of each of the first source-drain electrodes 19A and 19B.

The second gate electrode 19 and the first source-drain electrodes 19A and 19B may be covered with the interlayer insulating film 21. The interlayer insulating film 21 may contain, for example, a material having photosensitivity. Specifically, the interlayer insulating film 21 may include a stacked structure that includes a metal oxide film, i.e., a metal oxide film 23 in FIG. 11 described later, an inorganic insulating film, and an organic resin film in order from a position close to the substrate 11. As the metal oxide film, for example, an aluminum oxide ($Al_2O_3$) film having a thickness of 20 nm may be used. As the inorganic insulating film, for example, a silicon oxide ($SiO_2$) film having a thickness of 200 nm may be used. As the inorganic insulating film, a film such as a silicon nitride (SiN) film, or a silicon oxynitride (SiON) film may be used, or a stacked film of these films may be used. As the organic resin film, a resin film having photosensitivity may be used; for example, a polyimide resin film having a thickness of 3,000 nm may be used. As the organic resin film, a resin such as a novolac resin or an acrylic resin may be used. The interlayer insulating film 21 may have a stacked structure of the metal oxide film and one of the inorganic insulating film and the organic resin film. For example, the interlayer insulating film 21 may be configured by a silicon oxide (SiO$_2$) film having a thickness of 500 nm and an aluminum oxide (Al$_2$O$_3$) film having a thickness of 20 nm. The interlayer insulating film 21 may be configured by a polyimide resin film having a thickness of 3,000 nm and an aluminum oxide (Al$_2$O$_3$) film having a thickness of 20 nm.

The paired second source-drain electrodes 22A and 22B may be on the interlayer insulating film 21. The second source-drain electrodes 22A and 22B may be electrically coupled to the low-resistance region 17b of the second semiconductor layer 17 through contact holes provided in the interlayer insulating film 21. For example, each of the second source-drain electrodes 22A and 22B may contain metal such as molybdenum (Mo), tungsten (W), aluminum (Al), copper (Cu), silver (Ag), or titanium (Ti). The second source-drain electrodes 22A and 22B each may include an alloy, or may be a stacked film containing a plurality of metal films. The second source-drain electrodes 22A and 22B may each be a stacked film in which, for example, a titanium film having a thickness of about 50 nm, an aluminum film having a thickness of about 300 nm, and a titanium film having a thickness of about 50 nm are stacked in this order on the third insulating film 18.

[Storage Capacitor Cs]

The first electrode 13L may be in a selective region on the UC film 12. As described later, for example, the first electrode 13L may be in the same steps as those of the first semiconductor layer 13 of the first transistor Tr1. The first electrode 13L may contain poly-silicon that is caused to have a lower resistance. The first electrode 13L may include LTPS that is doped with an n-type impurity such as phosphorus (P). The first electrode 13L may have a thickness of about 50 nm.

The second electrode 15U may face the first electrode 13L with the first insulating film 14 in between. At least a portion of the second electrode 15U may be at a position overlapping the first electrode 13L in a plan view. In other words, electric charges may be accumulated between the second electrode 15U and the first electrode 13L. As described later, for example, the second electrode 15U may be formed in the same steps as those of the first gate electrode 15 of the first transistor Tr1, and contain the same material as that of the first gate electrode 15, and have the same thickness as that of the first gate electrode 15.

The third electrode 19U may face the second electrode 15U with the second insulating film 16 and the third insulating film 18 in between. At least a portion of the third electrode 19U may be provided at a position overlapping the second electrode 15U in a plan view. In other words, electric charges may be also accumulated between the third electrode 19U and the second electrode 15U. The third electrode 19U may be electrically coupled to the first electrode 13L through contact holes provided in the interlayer insulating film 21, the second insulating film 16, and the third insulating film 18. As described later, for example, the third electrode 19U may be formed in the same steps as those of the first source-drain electrode 19A and 19B of the first transistor Tr1 and the second gate electrode 19 of the second transistor Tr2. The third electrode 19U may include the same material as that of the first source-drain electrodes 19A and 19B (and the second gate electrode 19), and have the same thickness as that of the first source-drain electrodes 19A and 19B (and the second electrode 19). The third electrode 19U may be covered with the interlayer insulating film 21.

[Display Element Layer 20]

The display element layer 20 may include the plurality of pixels and a display element that is driven to perform display by the first transistor Tr1 and the second transistor Tr2. Examples of the display element may include an organic EL element. The organic EL element may include, for example, an anode electrode, an organic electro-luminescence layer, and a cathode electrode in order from side of the semiconductor device 10.

[Pixel Circuit]

Figure 3:
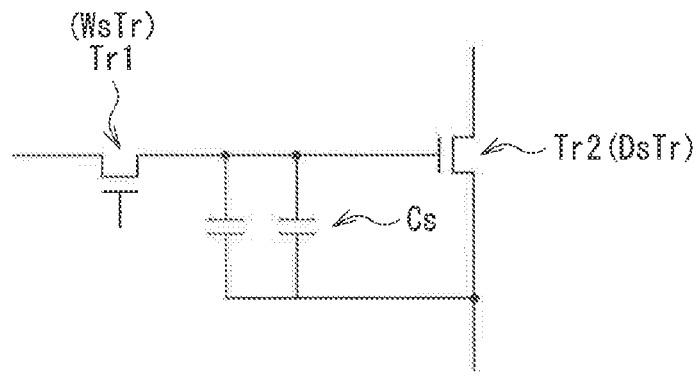
FIG. 3 is a schematic diagram of a configuration of a pixel circuit of the display unit according to at least one embodiment of the technology.

FIG. 3 is a schematic diagram of an example of the pixel circuit of the display unit 1 according to at least one embodiment of the technology. The pixel circuit may have a 2Tr1C circuit configuration. For example, the first transistor Tr1 may function as a switching transistor WsTr, and the second transistor Tr2 may function as a driving transistor DsTr. The storage capacitor Cs may store a predetermined voltage between a gate electrode and a source electrode of the driving transistor DsTr. In the display unit 1, such a pixel circuit may be provided for each pixel. In other words, the semiconductor device 10 may include a plurality of first transistors Tr1, a plurality of second transistors Tr2, and a plurality of storage capacitors Cs.

A gate electrode of the switching transistor WsTr may be coupled to, for example, a scanning line. One of a source electrode and a drain electrode of the switching transistor WsTr may be coupled to, for example, a signal line, and the other electrode may be coupled to the gate electrode of the driving transistor DsTr. For example, the first source-drain electrodes 19A and 19B of the first transistor Tr1 may be electrically coupled to the signal line and the second gate electrode 19 of the second transistor Tr2 through electrically conductive films 22C and 22D, respectively. For example, the electrically conductive films 22C and 22D may be formed in the same steps as those of the second source-drain electrodes 22A and 22B of the second transistor Tr2.

One of the source electrode or a drain electrode of the driving transistor DsTr may be coupled to, for example, a power supply line, and the other electrode may be coupled to, for example, the anode of the organic EL element. The storage capacitor Cs may be interposed between the gate electrode and the source electrode (i.e., an electrode on side of the organic EL element) of the driving transistor DsTr. For example, the third electrode 19U of the storage capacitor Cs may be electrically coupled to the second gate electrode 19 of the second transistor Tr2. The second electrode 15U may be electrically coupled to the anode of the organic EL element (i.e., one of the second source-drain electrodes 22A and 22B of the second transistor Tr2) through electrically conductive films 19E and 22E. For example, the electrically conductive film 19E may be formed simultaneously with the first source-drain electrodes 19A and 19B of the first transistor Tr1, and the electrically conductive film 22E may be formed in the same steps as those of the second source-drain electrodes 22A and 22B of the second transistor Tr2.

The switching transistor WsTr may control application of an image signal (i.e., signal voltage) to the gate electrode of the driving transistor DsTr. Specifically, the switching transistor WsTr may sample the voltage of the signal line (i.e., signal voltage) in response to the voltage applied to the scanning line, and write the signal voltage into the gate electrode of the driving transistor DsTr.

For example, the driving transistor DsTr may be coupled in series to each of the display elements such as the organic EL elements, and may control a current flowing through each of the display elements on the basis of magnitude of the signal voltage sampled by the switching transistor WsTr.

[Manufacturing Method]

Figure 4A:
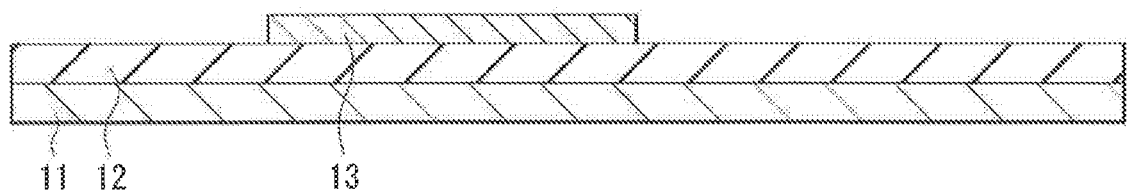
FIG. 4A is a schematic cross-sectional view of a semiconductor device during a process of manufacturing according to at least one embodiment of the technology.

The display unit 1 as described above may be manufactured in the following manner, for example. FIG. 4A to FIG.

10B are cross-sectional views of a semiconductor device during a process of manufacturing the display unit 1 according to at least one embodiment of the technology. Note that description of a thermal process, for example, is omitted in the following description for the sake of brevity.

Figure 4B:
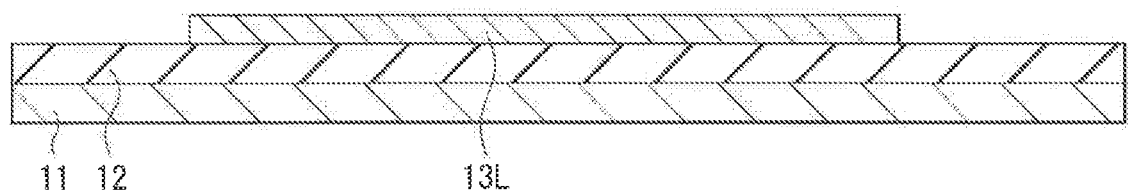
FIG. 4B is a schematic cross-sectional view of a semiconductor device during a process of manufacturing according to at least one embodiment of the technology.

After the UC film 12 is formed on the substrate 11, the first semiconductor layer 13 and the first electrode 13L may be first formed in a selective region on the UC film 12 in the same step as in FIGS. 4A and 4B. Specifically, the first semiconductor layer 13 and the first electrode 13L may be formed in the following manner. After the UC film 12 is formed, a film of amorphous silicon (a-Si:H) having a thickness of about 50 nm may be formed. Next, after dehydrogenation is performed, polycrystallization of the amorphous silicon may be performed through, for example, laser annealing. Thereafter, for example, resultant polysilicon may be processed through photolithography and etching. The poly-silicon that configures the first electrode 13L may be doped with, for example, phosphorus as an impurity. As a result, the first semiconductor layer 13 and the first electrode 13L are formed.

Figure 5A:
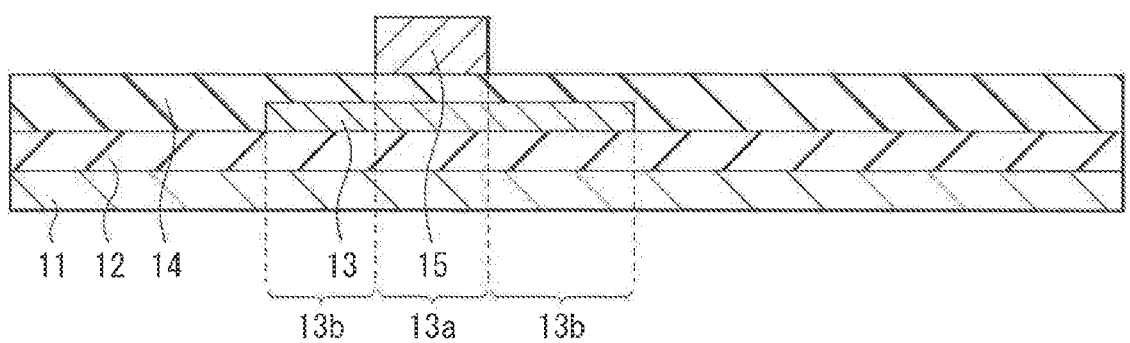
FIG. 5A is a schematic cross-sectional view of a semiconductor device during a process of manufacturing according to at least one embodiment of the technology.
Figure 5B:
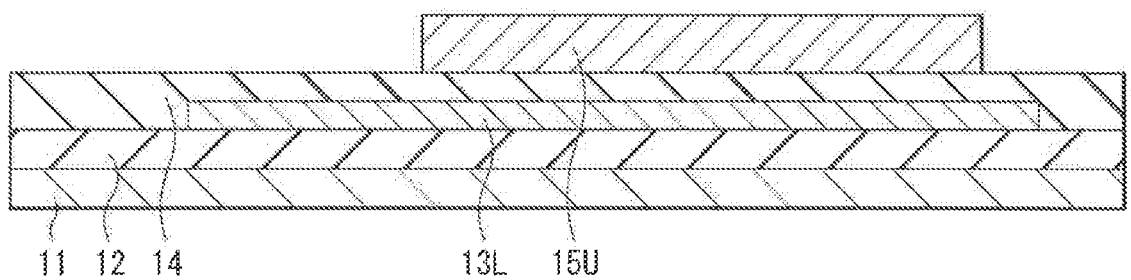
FIG. 5B is a schematic cross-sectional view of a semiconductor device during a process of manufacturing according to at least one embodiment of the technology.

Subsequently, the first insulating film 14 may be formed, and the first gate electrode 15 and the second electrode 15U may be formed on the first insulating film 14 in the same step, as in FIGS. 5A and 5B. Specifically, the first gate electrode 15 and the second electrode 15U may be formed in the following manner. First, a silicon oxide film having a thickness of about 100 nm may be formed on the entire surface of the substrate 11 by means of a chemical vapor deposition (CVD) method, for example, to form the first insulating film 14. In this situation, for example, Tetraethyl orthosilicate (TEOS) may be used as a raw material gas. Next, a film of an alloy of molybdenum and tungsten (MoW) having a thickness of 300 nm, for example, may be formed on the first insulating film 14. Thereafter, the MoW film may be processed through photolithography and etching. As the etching, for example, dry etching using carbon tetrafluoride ($CF_4$)/$O_2$ gas may be performed. As a result, the first gate electrode 15 and the second electrode 15U are formed. After the first gate electrode 15 is formed, the first semiconductor layer 13 at a part not overlapping the first gate electrode 15 in a plan view may be caused to have a lower resistance, thus forming the low-resistance region 13b. The low-resistance region 13b may be formed by, for example, doping the first semiconductor layer 13 with phosphorus as an impurity.

Figure 6A:
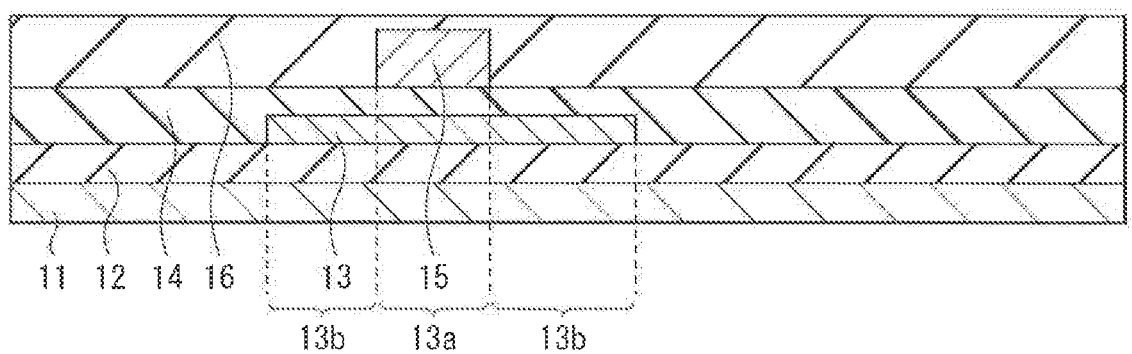
FIG. 6A is a schematic cross-sectional view of a semiconductor device during a process of manufacturing according to at least one embodiment of the technology.
Figure 6B:
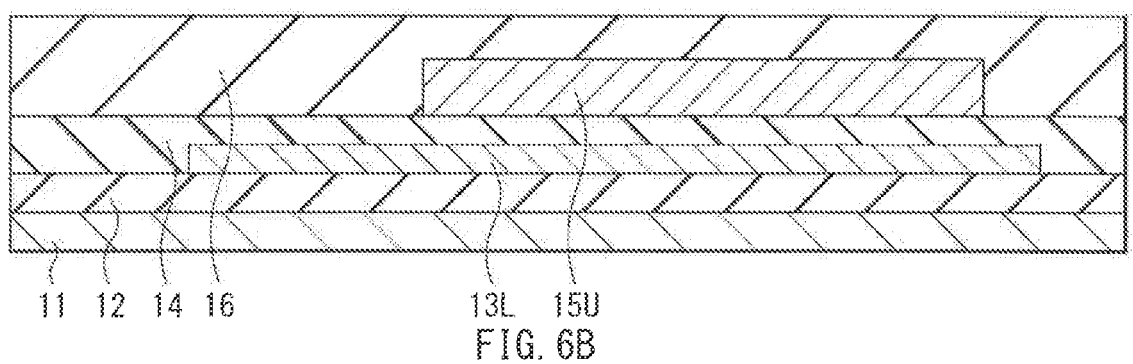
FIG. 6B is a schematic cross-sectional view of a semiconductor device during a process of manufacturing according to at least one embodiment of the technology.

After the first gate electrode 15 and the second electrode 15U are formed, the second insulating film 16 may be formed on the entire surface of the substrate 11 to cover the first gate electrode 15 and the second electrode 15U as in FIGS. 6A and 6B. The second insulating film 16 may be formed by forming, for example, a silicon nitride film having a thickness of about 150 nm and a silicon oxide film having a thickness of about 150 nm in this order by means of, for example, the CVD method. For example, silicon hydride ($SiH_4$) may be used as a process gas for formation of the silicon nitride film.

Figure 7A:
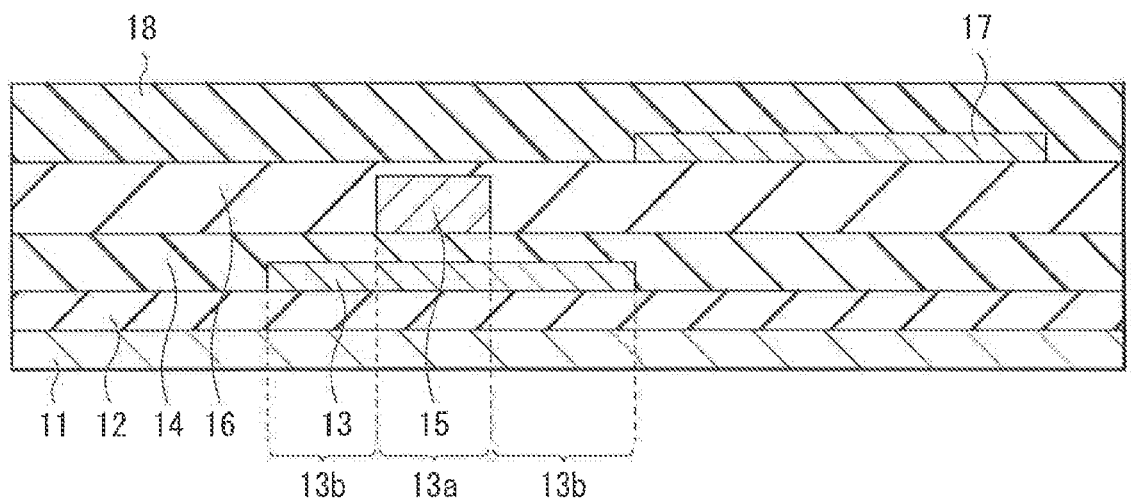
FIG. 7A is a schematic cross-sectional view of a semiconductor device during a process of manufacturing according to at least one embodiment of the technology.
Figure 7B:
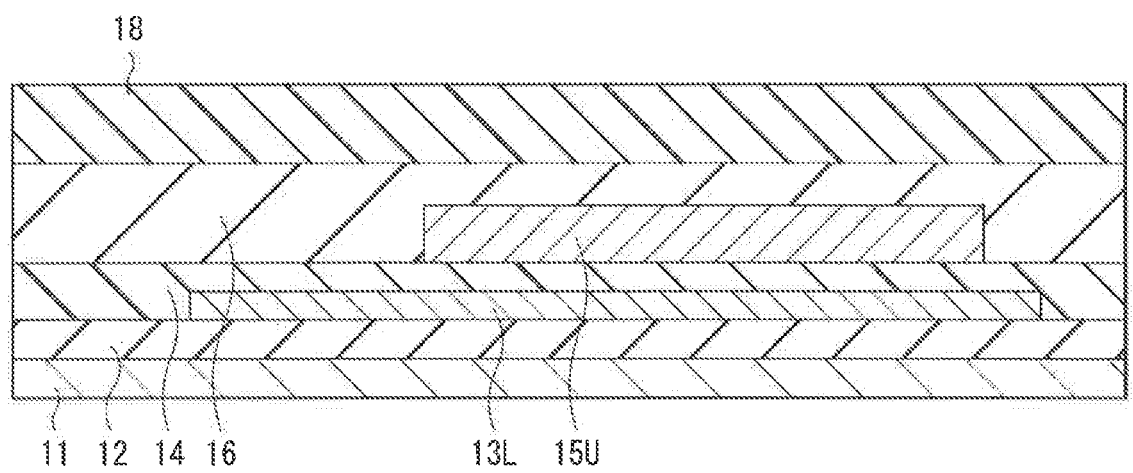
FIG. 7B is a schematic cross-sectional view of a semiconductor device during a process of manufacturing according to at least one embodiment of the technology.

After the second insulating film 16 is formed, the second semiconductor layer 17 and the third insulating film 18 may be formed in this order as in FIGS. 7A and 7B. Specifically, first, an oxide semiconductor film may be formed on the second insulating film 16 by means of, for example, a sputtering method. Next, the oxide semiconductor film may be processed through photolithography and etching. As a result, the second semiconductor layer 17 is formed in a selective region on the second insulating film 16. Subsequently, a silicon oxide film having a thickness of about 200 nm may be formed on the entire surface of the substrate 11 by means of, for example, the CVD method to cover the second semiconductor layer 17. As a result, the third insulating film 18 is formed.

Figure 8A:
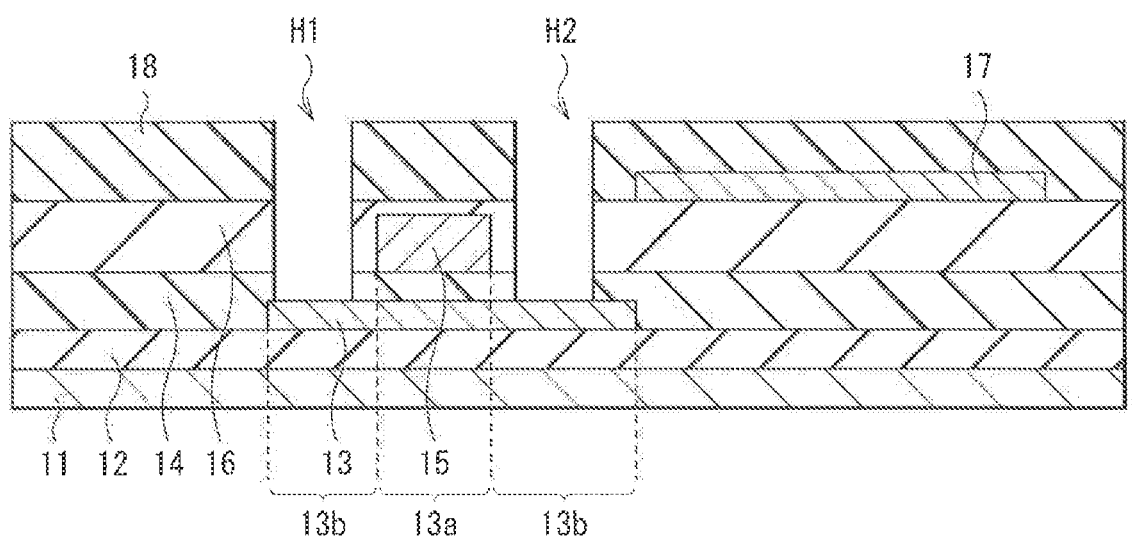
FIG. 8A is a schematic cross-sectional view of a semiconductor device during a process of manufacturing according to at least one embodiment of the technology.
Figure 8B:
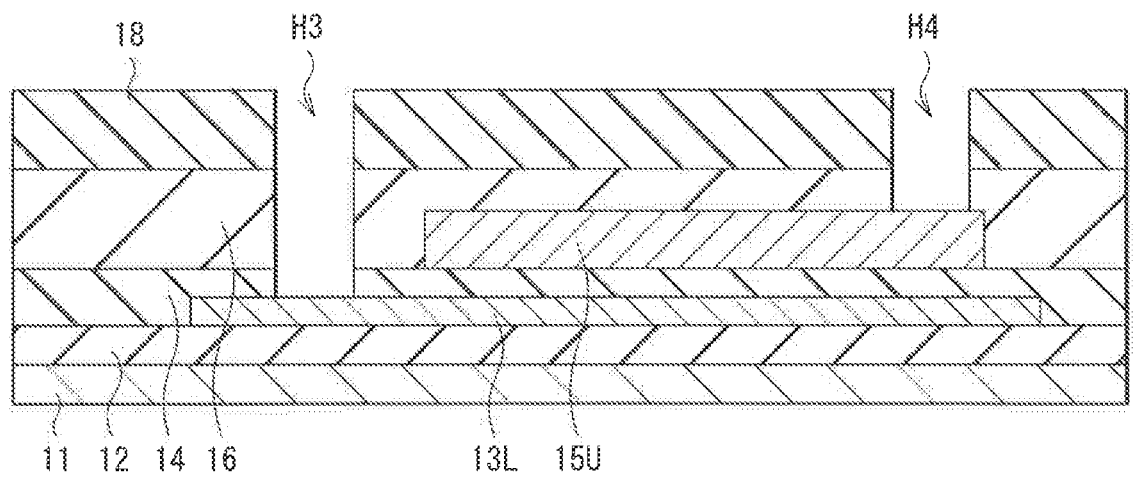
FIG. 8B is a schematic cross-sectional view of a semiconductor device during a process of manufacturing according to at least one embodiment of the technology.

Subsequently, as in FIGS. 8A and 8B, the contact holes H1 and H2 that reach the low-resistance region 13b of the first semiconductor layer 13, the contact hole H3 reaching the first electrode 13L, and the contact hole H4 reaching the second electrode 15U may be formed. The contact holes H1, H2, H3, and H4 may be formed through, for example, photolithography and etching. As the etching, for example, dry etching using $CF_4$-based gas may be performed.

Figure 9A:
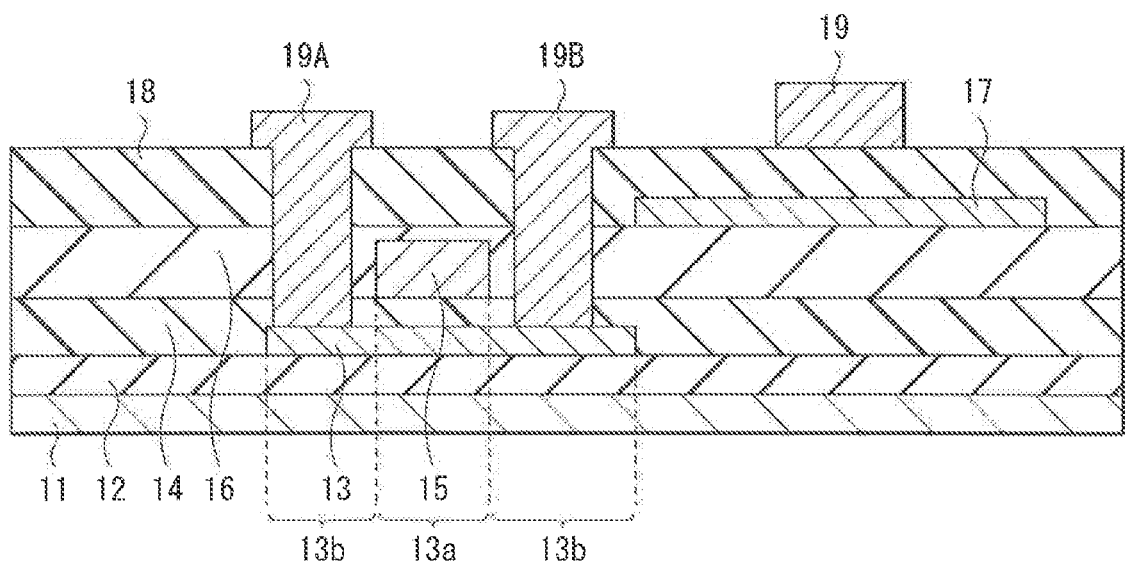
FIG. 9A is a schematic cross-sectional view of a semiconductor device during a process of manufacturing according to at least one embodiment of the technology.
Figure 9B:
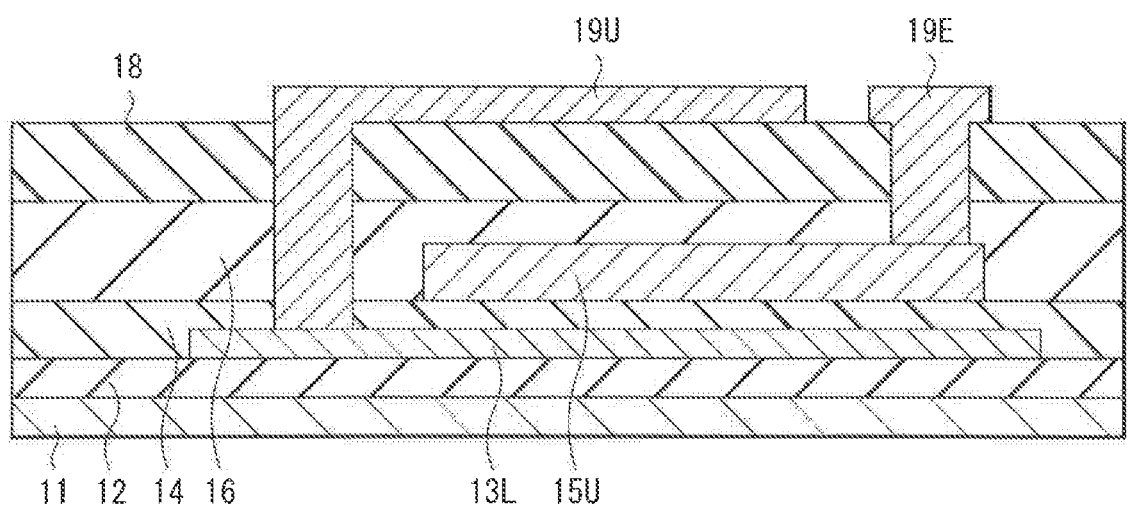
FIG. 9B is a schematic cross-sectional view of a semiconductor device during a process of manufacturing according to at least one embodiment of the technology.

After the contact holes H1, H2, H3, and H4 are formed, the first source-drain electrodes 19A and 19B that fill the contact holes H1 and H2, the second gate electrode 19, the third electrode 19U that fill the contact hole H3, and the electrically conductive film 19E that fill the contact hole H4 may be formed in the same step as in FIGS. 9A and 9B. Specifically, the first source-drain electrodes 19A and 19B, the second gate electrode 19, the third electrode 19U, and the electrically conductive film 19E may be formed in the following manner. First, for example, a film of titanium, a film of aluminum, and a film of titanium may be formed in this order on the third insulating film 18 by means of the sputtering method to form a metal stacked film. Next, the stacked film may be processed through, for example, photolithography and etching to form the first source-drain electrodes 19A and 19B, the second gate electrode 19, the third electrode 19U, and the electrically conductive film 19E in respective desired shapes. As the etching, for example, dry etching using a chlorine (Cl)-based gas may be performed.

Figure 10A:
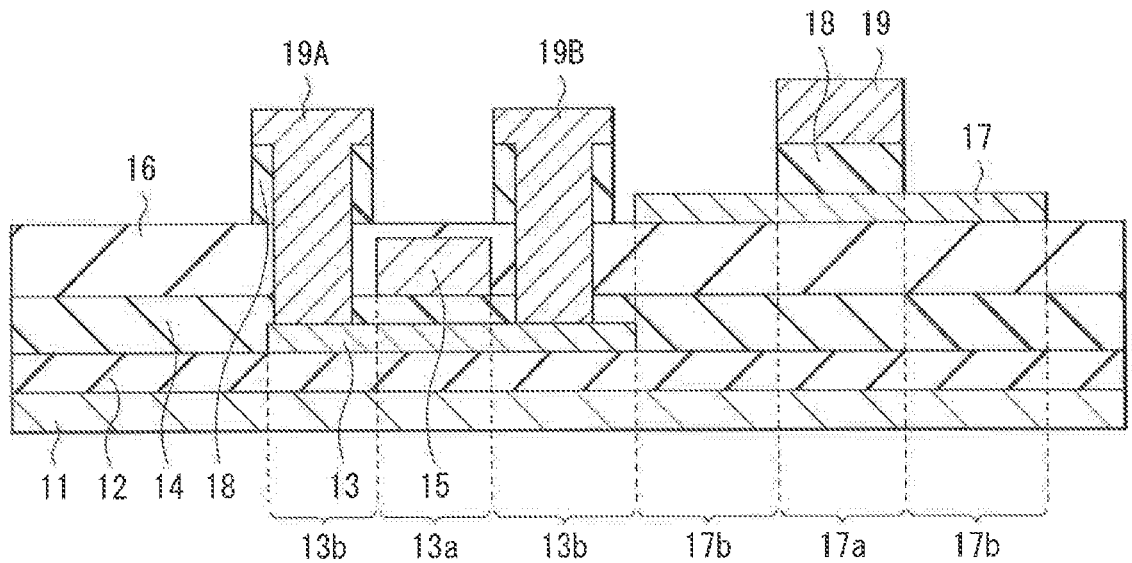
FIG. 10A is a schematic cross-sectional view a semiconductor device during a process of manufacturing according to at least one embodiment of the technology.
Figure 10B:
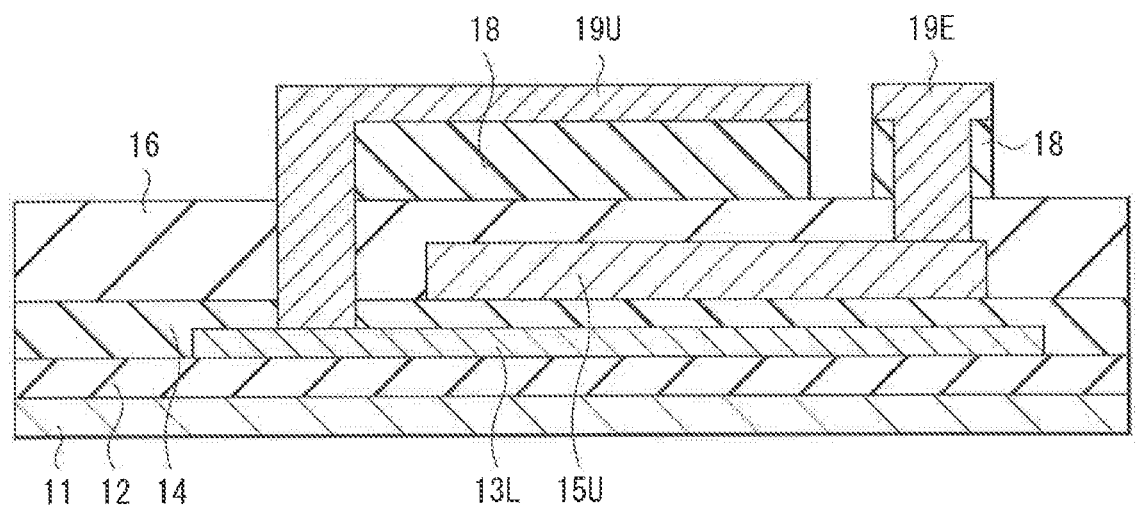
FIG. 10B is a schematic cross-sectional view of a semiconductor device during a process of manufacturing according to at least one embodiment of the technology.

Subsequently, as in FIG. 10A, the third insulating film 18 may be patterned with use of a pattern of the second gate electrode 19 as a mask. The patterning of the third insulating film 18 may be performed through, for example, the dry etching using the $CF_4$-based gas. Application of such dry etching causes a region of the second semiconductor layer 17 that is exposed from the third insulating film 18 to be damaged to have a lower resistance. As a result, the low-resistance region 17b is formed in the second semiconductor layer 17. In this situation, patterning using, as a mask, a pattern of each of the first source-drain electrodes 19A and 19B, the third electrode 19U, and the electrically conductive film 19E may also be performed as illustrated in FIG. 10B.

Figure 11:
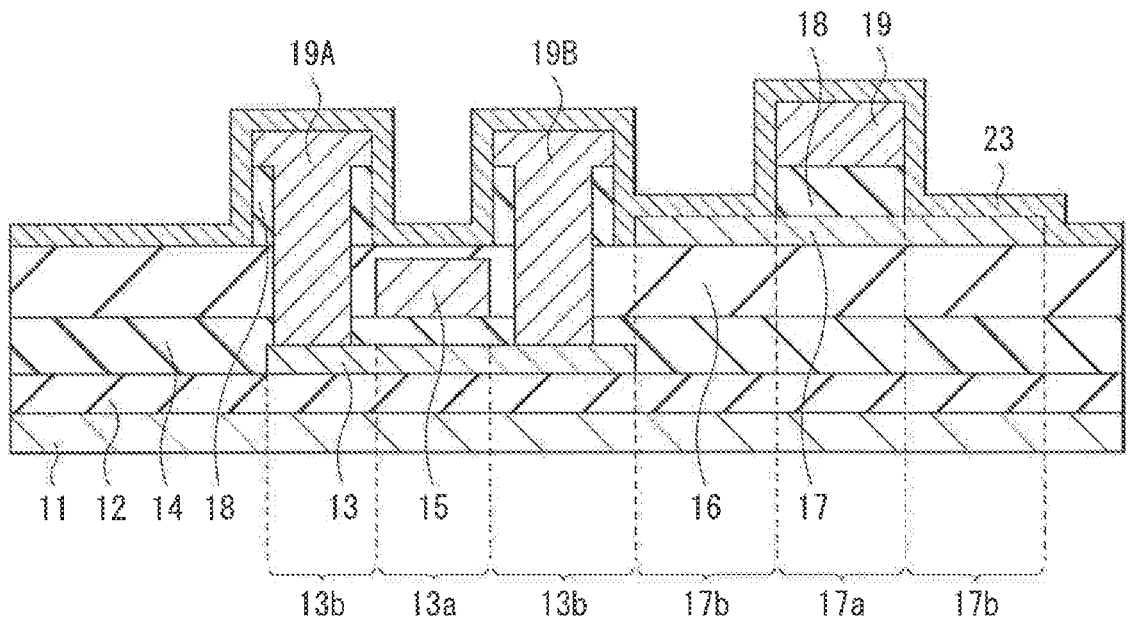
FIG. 11 is a schematic cross-sectional view of a semiconductor device during a process of manufacturing according to at least one embodiment of the technology.

After the low-resistance region 17b is formed in the second semiconductor layer 17, for example, the metal oxide film 23 may be formed in contact with the low-resistance region 17b as in FIG. 11. For example, a film such as an aluminum oxide ($Al_2O_3$) film having a thickness of about 20 nm may be formed as the metal oxide film 23 by means of the sputtering method. Forming such a metal oxide film 23 makes it possible to stabilize the electric resistance of the low-resistance region 17b.

After the third insulating film 18 is patterned, a film of a material having photosensitivity may be formed on the entire surface of the substrate 11 to form the interlayer insulating film 21. Next, the contact hole reaching the first source-drain electrodes 19A and 19B, the contact hole reaching the low-resistance region 17b of the second semiconductor layer 17, and the contact hole reaching the electrically conductive film 19E may be formed in the interlayer insulating film 21. When the metal oxide film 23 is formed, the contact hole reaching the low-resistance region 17b of the second semiconductor layer 17 may be also formed in the metal oxide film 23 through, for example, dry etching with use of, as a mask, a pattern of the interlayer insulating film 21 as the upper layer. Instead of dry etching, wet etching using alkali etchant may be performed.

After the respective contact holes reaching the first source-drain electrodes 19A and 19B, the second semiconductor layer 17, and the electrically conductive film 19E are formed, the electrically conductive films 22C and 22D, the second source-drain electrodes 22A and 22B, and the electrically conductive film 22E may be formed in the same steps. The electrically conductive films 22C and 22D may be formed to fill the contact hole reaching the first source-drain electrodes 19A and 19B. The second source-drain electrodes 22A and 22B may be formed to fill the contact hole reaching the low-resistance region 17b of the second semiconductor layer 17. The electrically conductive film 22E may be formed to fill the contact hole reaching the electrically conductive film 19E. Specifically, the electrically conductive films 22C and 22D, the second source-drain electrodes 22A and 22B, and the electrically conductive film 22E may be formed in the following manner. First, for example, a film of titanium, a film of aluminum, and a film of titanium may be formed in this order on the interlayer insulating film 21 by means of the sputtering method, to form a metal stacked film. Next, the stacked film may be processed through, for example, photolithography and etching, to form the electrically conductive films 22C and 22D, the second source-drain electrodes 22A and 22B, and the electrically conductive film 22E in respective desired shapes. As the etching, for example, dry etching using the Cl-based gas may be performed.

After the semiconductor device 10 in FIG. 2 is formed in the above-described manner, for example, the anode electrode, the organic electro-luminescence layer, and the cathode electrode may be formed in this order, to form the display element layer 20 on the semiconductor device 10. As a result, the display unit 1 in FIG. 1 is manufactured.

[Workings and Effects]

In the display unit 1, a selection pulse is supplied to the switching transistor WsTr (i.e., first transistor Tr1) of each of the pixels, to select the pixel. The signal voltage in response to the image signal is supplied to the selected pixel, and is stored in the storage capacitor Cs. The driving transistor DsTr (i.e., second transistor Tr2) is subjected to the on/off control in response to the signal stored by the storage capacitor Cs, and a drive current is injected into each of the display elements. This allows for light emission of the display element layer 20, thus causing color beams to be extracted from the respective pixels. Additive color mixture of the color beams allows color image display to be performed.

In the semiconductor device 10 according to at least one embodiment, the first semiconductor layer 13 of the first transistor Tr1 includes the poly-silicon, and the second semiconductor layer 17 of the second transistor Tr2 includes the oxide semiconductor. This helps to uniformize the characteristics and to improve reliability. Description thereof is given below.

For example, in a case of forming the semiconductor layers of all of the transistors in the semiconductor device with use of poly-silicon, each of the semiconductor layers may contain a grain boundary, and the state of the grain boundary is not constant. Accordingly, non-uniformity of the characteristics among the plurality of transistors is likely to occur.

In contrast, in a case of adopting a top-gate transistor having a self-aligned structure for all of the transistors in the semiconductor device, and of forming the semiconductor layers of the respective transistors with use of an oxide semiconductor, uniformity of the characteristics is improved. The oxide semiconductor, however, may be deteriorated due to influence of moisture, hydrogen, and so forth. This maintaining reliability difficult. In addition, when one of electrodes of the storage capacitor is formed in the same step as those of the semiconductor layer of the transistor, lowering the resistance of the oxide semiconductor of the storage capacitor is difficult, which complicates the process.

In at least one embodiment, a bottom-gate transistor may be used in which a semiconductor layer is configured by an oxide semiconductor. In this case, however, a parasitic capacitance tends to be increased. Therefore, a region for formation of the storage capacitor is increased. In addition, an issue of reliability occurs as with the top-gate transistor.

In contrast, in the semiconductor device 10, the poly-silicon is used for the first semiconductor layer 13 of the first transistor Tr1, and the oxide semiconductor is used for the second semiconductor layer 17 of the second transistor Tr2. This helps to suppress variation in the characteristics as compared with the case where the semiconductor layers of all of the transistors are made of the poly-silicon. Further, deterioration in the characteristics is suppressed as compared with the case where the semiconductor layers of all of the transistors are configured by the oxide semiconductor.

Further, the second transistor Tr2 is a top-gate transistor having a self-aligned structure, thus helping to reduce the parasitic capacitance and to reduce a region necessary for formation of the storage capacitor. In other words, higher definition is achieved. In addition, the second insulating film 16 below the second semiconductor layer 17 is able to function as a film that terminates a defect in the second semiconductor layer 17 by adjusting a factor such as the material and the thickness of the second insulating film 16. This helps to improve the reliability of the second transistor Tr2.

As described above, in at least one embodiment, the poly-silicon is used for the first semiconductor layer 13 of the first transistor Tr1, and the oxide semiconductor is used for the second semiconductor layer 17 of the second transistor Tr2. Thus, the characteristics are more uniform and reliability is improved.

In the display unit 1, the second transistor Tr2 having high uniformity among the devices is used as the driving transistor DsTr, thus helps to improve display uniformity.

Further, the storage capacitor Cs of the semiconductor device 10 is a capacitive element having a stacked structure. Therefore, storing larger capacitance per small area is possible.

Further, the first source-drain electrodes 19A and 19B of the first transistor Tr1 and the second gate electrode 19 of the second transistor Tr2 are formed in the same steps. In addition, the second insulating film 16 that covers the first gate electrode 15 of the first transistor Tr1 is below the second semiconductor layer 17 of the second transistor Tr2, and also functions as the UC film. Moreover, the first electrode 13L, the second electrode 15U, and the third electrode 19U of the storage capacitor Cs are able to be formed in the same steps as those of, respectively, the first semiconductor layer 13 of the first transistor Tr1, the first gate electrode 15 of the first transistor Tr1, and the first source-drain electrodes 19A and 19B (and second gate electrode 19 of second transistor Tr2). In this manner, manufacturing the semiconductor device 10 in a simple manner is possible by suppressing increases in a number of steps of photolithography.

In addition, using the second transistor Tr2 as the driving transistor DsTr and to configure the switching transistor WsTr with use of the other transistor (i.e., first transistor Tr1), helps to improve the reliability of the second transistor Tr2. Description thereof is given below. In the transistor using the oxide semiconductor, carrier density of the oxide semiconductor is varied depending on a factor such as a channel length. Therefore, transfer characteristics, electric reliability, and so forth are likely to be changed. When only the driving transistor DsTr is configured by the second transistor Tr2, however, adopting only a certain fixed channel length is possible. In other words, a channel length that may allow for achievement of desired transfer characteristics and electric reliability is determined, and a process condition specialized for the fixed channel length is adopted. This helps to improve the reliability of the second transistor Tr2.

In the following, additional examples of at least one embodiment are described. In the following description, the components same as those in the foregoing at least one embodiment are denoted by the same reference numerals, and descriptions thereof are omitted where appropriate.

Figure 12:
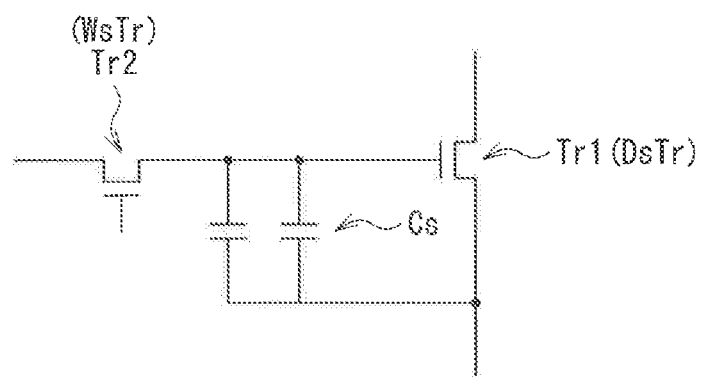
FIG. 12 is a schematic diagram of a configuration of a pixel circuit according to at least one embodiment of the technology.

FIG. 12 is a schematic diagram of a configuration of a pixel circuit according to at least one embodiment of the technology. The first transistor Tr1 may function as the driving transistor DsTr, and the second transistor Tr2 may function as the switching transistor WsTr. In the pixel circuit, the first transistor Tr1 having high reliability may be used as the driving transistor DsTr. This helps to improve reliability of the display unit 1.

Figure 13:
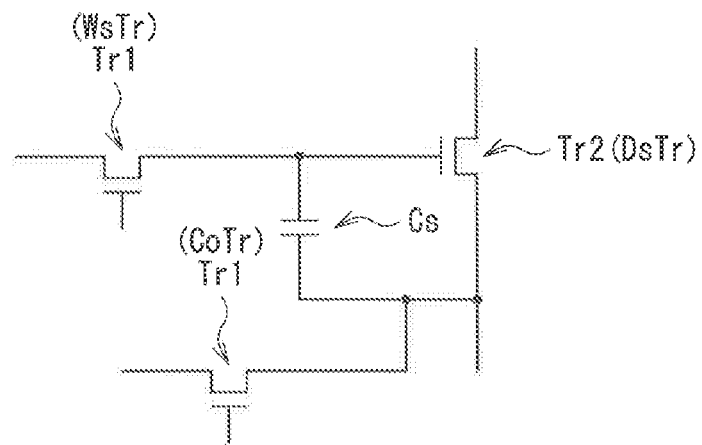
FIG. 13 is a schematic diagram of a configuration of a pixel circuit according to at least one embodiment of the technology.

FIG. 13 is a schematic diagram of a configuration of a pixel circuit according to at least one embodiment of the technology. The pixel circuit may have a 3Tr1C circuit configuration. The pixel circuit may include, for example, a cut-off transistor CoTr, in addition to the switching transistor WsTr and the driving transistor DsTr. The cut-off transistor CoTr may be the first transistor Tr1, or may be the second transistor Tr2.

The cut-off transistor CoTr may be configured to reset, for example, the source electrode (anode potential) of the driving transistor DsTr to a certain potential. A gate electrode of the cut-off transistor CoTr may be coupled to, for example, a control line. One of a source electrode or a drain electrode of the cut-off transistor CoTr may be coupled to the source electrode of the driving transistor DsTr, and the other electrode may be coupled to the power supply line (reset potential).

Figure 14:
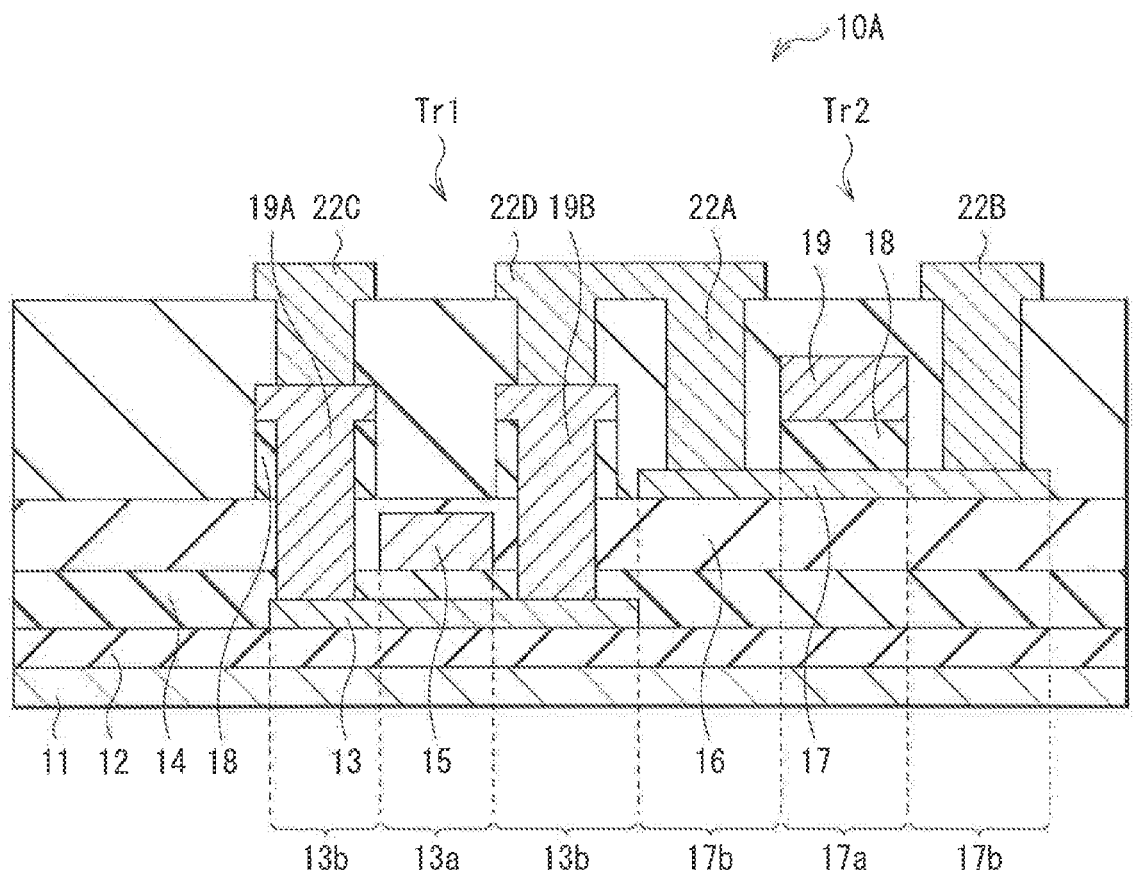
FIG. 14 is a cross-sectional view of a configuration of a semiconductor device according to Modification Example 3.
Figure 15:
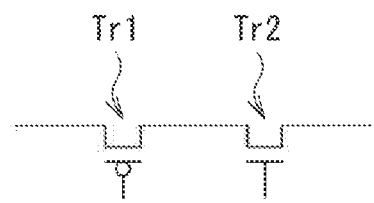
FIG. 15 is a schematic diagram of a circuit configuration of the semiconductor device according to at least one embodiment of the technology.

FIG. 14 is a cross-sectional diagram of a main part of a semiconductor device according to at least one embodiment of the technology. FIG. 15 is a schematic diagram of a configuration of the semiconductor device 10A according to at least one embodiment of the technology. An inverter may be configured with use of the first transistor Tr1 and the second transistor Tr2. Except this point, the semiconductor device 10A has a similar configuration as well as similar workings and effects to those of the semiconductor device 10 of at least one embodiment.

For example, the semiconductor device 10A may be configured to allow the first transistor Tr1 to be a p channel and the second transistor Tr2 to be an n channel. The first source-drain electrode 19B and the second source-drain electrode 22A are electrically coupled to each other through the electrically conductive film 22D.

Figure 16:
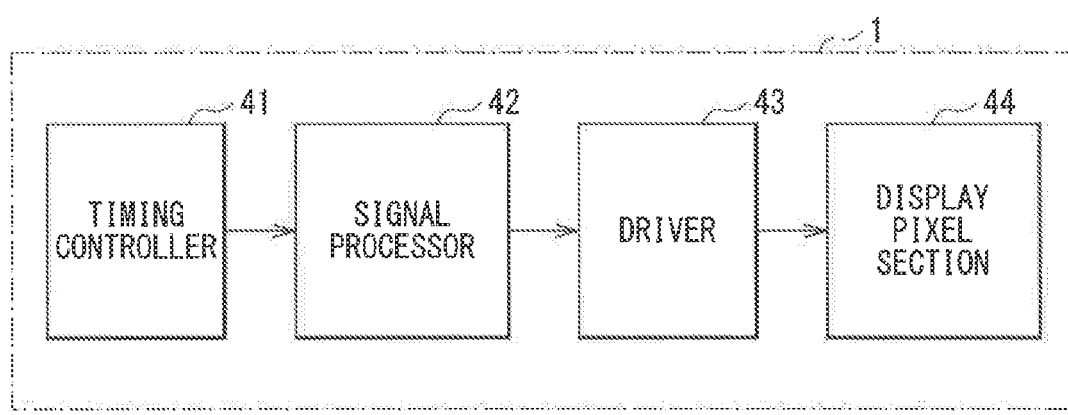
FIG. 16 is a block diagram of a functional configuration of the display unit according to at least one embodiment of the technology.

FIG. 16 is a functional block configuration of the display unit 1 according to at least one embodiment of the technology.

The display unit 1 may display, as an image, an image signal inputted from the outside or generated inside the display unit 1. The display unit 1 may also be applied to, for example, a liquid crystal display aside from the above-described organic EL display. The display unit 1 may include, for example, a timing controller 41, a signal processor 42, a driver 43, and a display pixel section 44.

The timing controller 41 may include a timing generator that generates various timing signals, i.e., control signals. The timing controller 41 may control driving of the signal processor 42, for example, on the basis of the various timing signals. For example, the signal processor 42 may perform a predetermined correction on a digital image signal inputted from the outside, and may output the thus-obtained image signal to the driver 43. The driver 43 may include circuits such as a scanning line drive circuit and a signal line drive circuit, for example. The driver 43 may drive each pixel of the display pixel section 44 through various control lines. The display pixel section 44 may include, for example, a display element, i.e., the above-described display element layer 20 and a pixel circuit. Examples of the display element may include an organic EL element and a liquid crystal display element. The pixel circuit may be provided to drive the display element for each pixel. Each of the above-described semiconductor devices 10 and 10A may be used, for example, for various circuits constituting a portion of the driver 43 or a portion of the display pixel section 44, among the above-described components.

[Application Examples Other than Display Unit]

Figure 17:
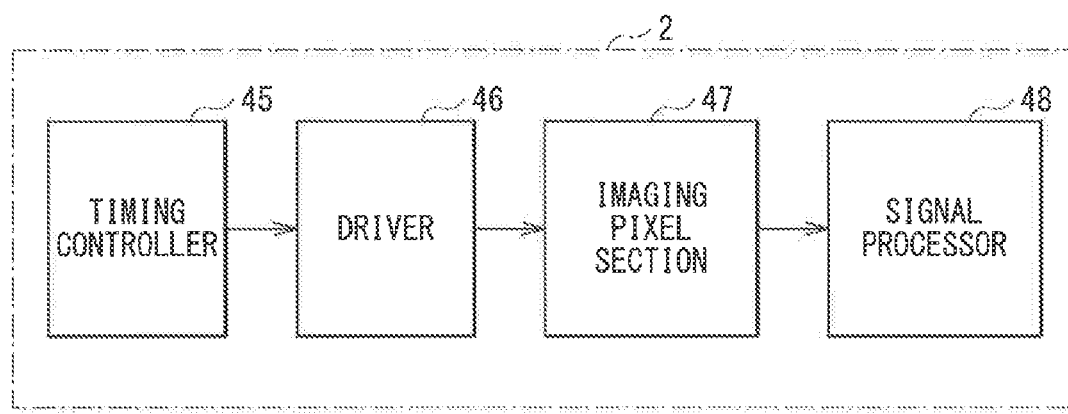
FIG. 17 is a block diagram of a configuration of an imaging unit according to at least one embodiment of the technology.

In the foregoing at least one embodiment, the display unit 1 has been described as the application example of the semiconductor devices 10 and 10A. However, the semiconductor devices 10 and 10A may also be used for an imaging unit, i.e., an imaging unit 2 as in FIG. 17, aside from the display unit 1.

The imaging unit 2 may be, for example, a solid-state imaging unit that obtains an image as an electric signal. The imaging unit 2 may be configured by, for example, a charge coupled device (CCD) image sensor or a complementary metal oxide semiconductor (CMOS) image sensor. The imaging unit 2 may include, for example, a timing controller 45, a driver 46, an imaging pixel section 47, and a signal processor 48.

The timing controller 45 may include a timing generator that generates various timing signals (i.e., control signals). The timing controller 45 may control driving of the driver 46 on the basis of the various timing signals. The driver 46 may include, for example, a row selection circuit, an AD conversion circuit, and a horizontal transfer scanning circuit. The driver 46 may perform driving to read a signal from each pixel of the imaging pixel section 47 through various control lines. The imaging pixel section 47 may include, for example, an imaging element, i.e., a photoelectric conversion element such as a photodiode, and a pixel circuit for reading of a signal. The signal processor 48 may apply various signal processes to the signal obtained from the imaging pixel section 47. Each of the above-described semiconductor device 10 and 10A may be used, for example, for various circuits that constitute a portion of the driver 46 or a portion of the imaging pixel section 47, among the above-described components.

[Example of Various Electronic Apparatuses]

Figure 18:
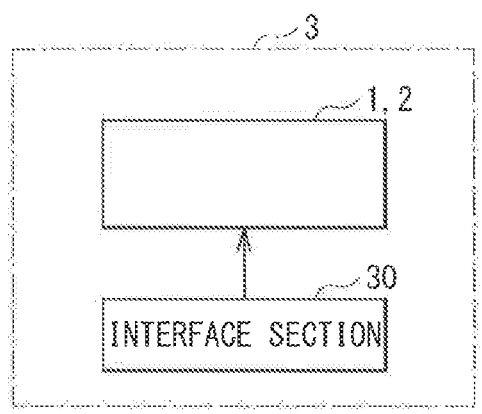
FIG. 18 is a block diagram of a configuration of an electronic apparatus according to at least one embodiment of the technology.

The display unit 1 (or imaging unit 2) described in the foregoing at least one embodiment may be used in various types of electronic apparatuses. FIG. 18 is a functional block configuration of an electronic apparatus 3 according to at least one embodiment of the technology. Examples of the electronic apparatus 3 may include a television, a personal computer (PC), a smartphone, a tablet PC, a mobile phone, a digital still camera, or a digital video camera.

The electronic apparatus 3 may include, for example, the above-described display unit 1 (or imaging unit 2) and an interface section 30. The interface section 30 may be an input section that receives, for example, various signals and power from the outside. The interface section 30 may include a user interface such as a touch panel, a keyboard, and operation buttons, for example.

Although the technology has been described with reference to at least one embodiment, the technology is not limited thereto, but may be modified in a wide variety of ways. For example, factors such as a material and a thickness of each layer, and a film-forming method as well as a film-forming condition exemplified in the foregoing example embodiment, etc. are illustrative and non-limiting. Any other material, any other thickness, any other film-forming method, any other film forming condition, and any other factor may be adopted besides those described above.

In addition, FIG. 2 includes the case where the electrically conductive films 22C, 22D, and 22E are provided; however, at least one of the electrically conductive films 22C, 22D, and 22E is omitted. For example, when the first source-drain electrodes 19A and 19B and the electrically conductive film 19E are not etched in the steps of forming the second source-drain electrodes 22A and 22B, the electrically conductive films 22C, 22D, and 22E may be omitted.

The effects described in the foregoing at least one embodiment are mere examples. The effects according to at least one embodiment of the disclosure may be other effects, or may further include other effects in addition to the effects described hereinabove.

The technology may also have the following configurations in at least one embodiment.

(1)

A semiconductor device including a substrate. The semiconductor device further includes a first transistor including a first semiconductor layer and a first gate electrode in this order on the substrate. The first semiconductor layer includes poly-silicon. The first gate electrode faces the first semiconductor layer. The semiconductor device further includes a second transistor including a second semiconductor layer and a second gate electrode in this order on the substrate. The second semiconductor layer includes an oxide semiconductor. The second gate electrode face the second semiconductor layer.

(2)

The semiconductor device according to (1), in which the first transistor includes a plurality of first transistors, and the second transistor includes a plurality of second transistors.

(3)

The semiconductor device according to (1) or (2), in which the second semiconductor layer includes a channel region and a low-resistance region, the channel region overlaps the second gate electrode in a plan view, and the low-resistance region is adjacent to the channel region.

(4)

The semiconductor device according to any one of (1) to (3), in which the first transistor further includes a pair of first source-drain electrodes electrically coupled to the first semiconductor layer, and the pair of first source-drain electrodes and the second gate electrode contain a same constituent material and have a same thickness.

(5)

The semiconductor device according to any one of (1) to (4), further including a first insulating film between the first semiconductor layer and the first gate electrode. The semiconductor device further includes a second insulating film that covering the first gate electrode. The first insulating film and the second insulating film are between the substrate and the second semiconductor layer.

(6)

The semiconductor device according to (5), further including a third insulating film between the second semiconductor layer and the second gate electrode.

(7)

The semiconductor device according to (6), in which the third insulating film has a same planar shape as a planar shape of the second gate electrode.

(8)

The semiconductor device according to (7), in which the second insulating film is a stacked film that includes a silicon nitride film and a silicon oxide film in order from a position close to the first insulating film.

(9)

The semiconductor device according to (7) or (8), further including a storage capacitor that includes a first electrode, a second electrode, and a third electrode in order from a position close to the substrate. The third electrode is electrically coupled to the first electrode. The first electrode, the second electrode, and the third electrode have a mutually overlapping part in a plan view.

(10)

The semiconductor device according to (9), in which the first electrode contains poly-silicon and has a thickness same as a thickness of the first semiconductor layer. The second electrode contains a same material as a material of the first gate electrode and has a same thickness as a thickness of the first gate electrode. The third electrode includes a same material as a material of the second gate electrode and has a thickness same as a thickness of the second gate electrode.

(11)

The semiconductor device according to (10), in which the first insulating film is between the first electrode and the second electrode, and the second insulating film and the third insulating film are between the second electrode and the third electrode.

(12)

The semiconductor device according to any one of (1) to (11), in which the first transistor and the second transistor are configured as an inverter.

(13)

The semiconductor device according to any one of (1) to (3), in which the first semiconductor layer contains low-temperature poly-silicon.

(14)

A display unit includes a semiconductor device. The display unit further includes a display element layer on the semiconductor device, the display element layer including a plurality of pixels. The semiconductor device includes a substrate. The semiconductor device further includes a first transistor including a first semiconductor layer and a first gate electrode in this order on the substrate. The first semiconductor layer includes poly-silicon. The first gate electrode faces the first semiconductor layer. The semiconductor device further includes a second transistor including a second semiconductor layer and a second gate electrode in this order on the substrate. The second semiconductor layer includes an oxide semiconductor. The second gate electrode faces the second semiconductor layer.

(15)

The display unit according to (14), in which the semiconductor device includes pixel circuits of the respective pixels, and in each of the pixel circuits, the first transistor is configured to function as a switching transistor, and the second transistor is configured to function as a driving transistor.

(16)

The display unit according to (15), in which the first transistor includes two first transistors in each of the pixel circuits, and one of the first transistors is configured to function as the switching transistor, and the other of the first transistors is configured to function as a cut-off transistor.

(17)

The display unit according to (14), in which the semiconductor device includes pixel circuits of the respective pixels, and in each of the pixel circuits, the first transistor is configured to function as a driving transistor, and the second transistor is configured to function as a switching transistor.

(18)

A method of manufacturing a semiconductor device includes forming, on a substrate, a first semiconductor layer including poly-silicon and a first gate electrode facing the first semiconductor layer in this order to form a first transistor. The method further includes forming, on the substrate, a second semiconductor layer including an oxide semiconductor and a second gate electrode facing the second semiconductor layer in this order to form a second transistor.

(19)

The method of manufacturing a semiconductor device according to (18), further including forming first source-drain electrodes electrically coupled to the first semiconductor layer in a step same as the forming of the second gate electrode.

(20)

The method of manufacturing a semiconductor device according to (19), further including forming a storage capacitor. The forming of the storage capacitor includes forming a first electrode in a step same as a step of the first semiconductor layer. The forming of the storage capacitor further includes forming a second electrode in a step same as a step of the first gate electrode. The forming of the storage capacitor further includes forming a third electrode electrically coupled to the first electrode, in a step same as a step of the first source-drain electrodes.

In the semiconductor device and the display unit according to at least one embodiment of the technology, the first semiconductor layer of the first transistor includes the poly-silicon, and the second semiconductor layer of the second transistor includes the oxide semiconductor. This helps to suppress variation in the characteristics as compared with a case where the semiconductor layers of all of the transistors contain poly-silicon. Further, deterioration in the characteristics is suppressed as compared with a case where the semiconductor layers of all of the transistors are configured by an oxide semiconductor.

In the method of manufacturing a semiconductor device according to at least one embodiment of the technology, the first semiconductor layer of the first transistor is formed to include the poly-silicon, and the second semiconductor layer of the second transistor is formed to include the oxide semiconductor. This helps to suppress variation in the characteristics as compared with a case where the semiconductor layers of all of the transistors are made of the poly-silicon. Further, deterioration in the characteristics is suppressed as compared with a case where the semiconductor layers of all of the transistors are configured by the oxide semiconductor.

According to the semiconductor device, the method of manufacturing the semiconductor device, and the display unit of at least one embodiment of the technology, the first semiconductor layer of the first transistor includes the poly-silicon, and the second semiconductor layer of the second transistor includes the oxide semiconductor. Accordingly, uniformizing the characteristics and improving reliability is possible. Note that the effects described herein are not necessarily limitative, and may be any effects described in the disclosure.

Although the technology has been described in terms of exemplary embodiments, this disclosure is not limited thereto. One of ordinary skill in the art would appreciate that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A semiconductor device, comprising:
   a substrate;
   a first transistor comprising:
      a first semiconductor layer over the substrate, the first semiconductor layer comprising poly-silicon, and
      a first gate electrode over the first semiconductor layer, the first gate electrode facing the first semiconductor layer;
   a second transistor comprising:
      a second semiconductor layer over the substrate, the second semiconductor layer comprising an oxide semiconductor, and
      a second gate electrode over the second semiconductor layer, the second gate electrode facing the second semiconductor layer;
   a storage capacitor, wherein the second transistor is between the first transistor and the storage capacitor in a direction parallel to a top surface of the substrate, the storage capacitor comprising:
      a first electrode over the substrate,
      a second electrode over the first electrode, and
      a third electrode over the second electrode, the third electrode being electrically coupled to the first electrode, and overlapping the first electrode and the second electrode in a plan view;
   a first insulating film between the first semiconductor layer and the first gate electrode;
   a second insulating film covering the first gate electrode, wherein the first insulating film and the second insulating film are between the substrate and the second semiconductor layer; and
   a plurality of third insulating films including
      one of the plurality of third insulating films at the storage capacitor between the second insulating film and the third electrode, and
      another of the plurality of third insulating films at the second transistor between the second semiconductor layer and the second gate electrode, the another of the plurality of third insulating films having a thickness less than that of the one of the plurality of third insulating films at the storage capacitor between the second insulating film and the third electrode,
wherein the second insulating film and the one of the plurality of third insulating films are between the second electrode and the third electrode, the one of the plurality of third insulating films directly contacting the third electrode.

2. The semiconductor device according to claim 1, wherein
the first transistor comprises a plurality of first transistors, and
the second transistor comprises a plurality of second transistors.

3. The semiconductor device according to claim 1, wherein the second semiconductor layer comprises a channel region and a low-resistance region, the channel region overlapping the second gate electrode in a plan view, and the low-resistance region being adjacent to the channel region.

4. The semiconductor device according to claim 1, wherein
the first transistor further includes a pair of first source-drain electrodes electrically coupled to the first semiconductor layer, and
each source-drain electrode of the pair of first source-drain electrodes and the second gate electrode comprise a same material and have a same thickness.

5. The semiconductor device according to claim 1, wherein each of the plurality of third insulating films has a planar shape, and the second gate electrode has the planar shape.

6. The semiconductor device according to claim 5, wherein the second insulating film comprises a stacked film, and the stacked film comprises:
a silicon nitride film over the first insulating film, and
a silicon oxide film over the silicon nitride film.

7. The semiconductor device according to claim 5, wherein
the first electrode comprises poly-silicon and has a first thickness,
the first semiconductor layer has the first thickness,
the second electrode comprises a first material and has a second thickness,
the first gate electrode comprises the first material and has the second thickness,
the third electrode comprises a second material and a third thickness, and
the second gate electrode comprises the second material and the third thickness.

8. The semiconductor device according to claim 7, wherein
the first insulating film is between the first electrode and the second electrode.

9. The semiconductor device according to claim 1, wherein the first transistor and the second transistor are connected to form an inverter.

10. The semiconductor device according to claim 1, wherein the first semiconductor layer comprises low-temperature poly-silicon.

11. A display unit comprising:
a semiconductor device; and
a display element layer over the semiconductor device, the display element layer comprising a plurality of pixels,
wherein the semiconductor device comprises:
a substrate,
a first transistor comprising:
a first semiconductor layer over the substrate, the first semiconductor layer comprising poly-silicon, and
a first gate electrode over the first semiconductor layer, the first gate electrode facing the first semiconductor layer,
a second transistor comprising:
a second semiconductor layer over the substrate, the second semiconductor layer comprising an oxide semiconductor, and
a second gate electrode over the second semiconductor layer, the second gate electrode facing the second semiconductor layer,
a storage capacitor, wherein the second transistor is between the first transistor and the storage capacitor in a direction parallel to a top surface of the substrate, the storage capacitor comprising:
a first electrode over the substrate,
a second electrode over the first electrode, and
a third electrode over the second electrode, the third electrode being electrically coupled to the first electrode, and overlapping the first electrode and the second electrode in a plan view,
a first insulating film between the first semiconductor layer and the first gate electrode,
a second insulating film covering the first gate electrode, wherein the first insulating film and the second insulating film are between the substrate and the second semiconductor layer, and
a plurality of third insulating films including
one of the plurality of third insulating films at the storage capacitor between the second insulating film and the third electrode, and
another of the plurality of third insulating films at the second transistor between the second semiconductor layer and the second gate electrode, the another of the plurality of third insulating films having a thickness less than that of the one of the plurality of third insulating films at the storage capacitor between the second insulating film and the third electrode, and
the second insulating film and the one of the plurality of third insulating films are between the second electrode and the third electrode, the one of the plurality of third insulating films directly contacting the third electrode.

12. The display unit according to claim 11, wherein
the semiconductor device comprises pixel circuits of the plurality of pixels, and
each of the pixel circuits comprises
the first transistor as a switching transistor, and
the second transistor as a driving transistor.

13. The display unit according to claim 12, wherein
the first transistor comprises a plurality of pixel circuit transistors in each of the pixel circuits, and
a first pixel circuit transistor of the plurality of pixel circuit transistors is the switching transistor, and a second pixel circuit transistor of the pixel circuit transistors is as a cut-off transistor.

14. The display unit according to claim 11, wherein
the semiconductor device includes pixel circuits of the plurality of pixels, and
each of the pixel circuits comprises:
the first transistor as a driving transistor, and
the second transistor as a switching transistor.

15. A semiconductor device, comprising:
a substrate;
a first transistor comprising:

a first semiconductor layer over the substrate, the first semiconductor layer comprising poly-silicon, and
a first gate electrode over the first semiconductor layer, the first gate electrode facing the first semiconductor layer;
a second transistor comprising:
a second semiconductor layer over the substrate, the second semiconductor layer comprising an oxide semiconductor, and
a second gate electrode over the second semiconductor layer, the second gate electrode facing the second semiconductor layer;
a storage capacitor, wherein the second transistor is between the first transistor and the storage capacitor in a direction parallel to a top surface of the substrate, the storage capacitor comprising:
a first electrode over the substrate,
a second electrode over the first electrode, and
a third electrode over the second electrode, the third electrode being electrically coupled to the first electrode, and overlapping the first electrode and the second electrode in a plan view;
a first insulating film between the first semiconductor layer and the first gate electrode;
a second insulating film covering the first gate electrode, wherein the first insulating film and the second insulating film are between the substrate and the second semiconductor layer; and
a third insulating film between the second semiconductor layer and the second gate electrode, wherein the storage capacitor further includes a first capacitance formed by the first gate electrode layer and the first semiconductor layer, and a second capacitance formed by the first gate electrode layer and the second gate electrode layer
with the following:
a plurality of third insulating films including
one of the plurality of third insulating films at the storage capacitor between the second insulating film and the third electrode, and
another of the plurality of third insulating films at the second transistor between the second semiconductor layer and the second gate electrode, the another of the plurality of third insulating films having a thickness less than that of the one of the plurality of third insulating films at the storage capacitor between the second insulating film and the third electrode.

* * * * *